US011018147B1

(12) United States Patent
Kim et al.

(10) Patent No.: US 11,018,147 B1
(45) Date of Patent: May 25, 2021

(54) METHOD OF FORMING SPLIT GATE MEMORY CELLS WITH THINNED TUNNEL OXIDE

(71) Applicant: Silicon Storage Technology, Inc., San Jose, CA (US)

(72) Inventors: Jinho Kim, Saratoga, CA (US); Elizabeth Cuevas, Los Gatos, CA (US); Parviz Ghazavi, San Jose, CA (US); Bernard Bertello, Bouches du Rhones (FR); Gilles Festes, Fuveau (FR); Catherine Decobert, Pourrieres (FR); Yuri Tkachev, Sunnyvale, CA (US); Bruno Villard, Aix en Provence (FR); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/781,798

(22) Filed: Feb. 4, 2020

(51) Int. Cl.
| | |
|---|---|
| *H01L 21/00* | (2006.01) |
| *H01L 27/11534* | (2017.01) |
| *H01L 21/28* | (2006.01) |
| *H01L 21/311* | (2006.01) |
| *H01L 21/02* | (2006.01) |
| *H01L 29/423* | (2006.01) |
| *H01L 29/08* | (2006.01) |
| *H01L 21/027* | (2006.01) |

(Continued)

(52) U.S. Cl.
CPC .... *H01L 27/11534* (2013.01); *H01L 21/0223* (2013.01); *H01L 21/0276* (2013.01); *H01L 21/28079* (2013.01); *H01L 21/31111* (2013.01); *H01L 27/11521* (2013.01); *H01L 29/0847* (2013.01); *H01L 29/40111* (2019.08); *H01L 29/42328* (2013.01); *H01L 29/7883* (2013.01)

(58) Field of Classification Search
CPC ......... H01L 27/11534; H01L 29/40111; H01L 21/0223; H01L 21/0276; H01L 21/28079; H01L 21/31111; H01L 27/11521; H01L 29/0847; H01L 29/42328; H01L 29/7883
See application file for complete search history.

(56) References Cited

U.S. PATENT DOCUMENTS

| | | | |
|---|---|---|---|
| 5,029,130 A | 7/1991 | Yeh | |
| 5,512,505 A * | 4/1996 | Yuan | ................. H01L 27/11521 438/264 |
| 6,297,099 B1 | 10/2001 | Hsieh et al. | |

(Continued)

*Primary Examiner* — Richard A Booth
(74) *Attorney, Agent, or Firm* — DLA Piper LLP (US)

(57) ABSTRACT

A method of forming a memory device includes forming a floating gate on a memory cell area of a semiconductor substrate, having an upper surface terminating in an edge. An oxide layer is formed having first and second portions extending along the logic and memory cell regions of the substrate surface, respectively, and a third portion extending along the floating gate edge. A non-conformal layer is formed having a first, second and third portions covering the oxide layer first, second and third portions, respectively. An etch removes the non-conformal layer third portion, and thins but does not entirely remove the non-conformal layer first and second portions. An etch reduces the thickness of the oxide layer third portion. After removing the non-conformal layer first and second portions, a control gate is formed on the oxide layer second portion and a logic gate is formed on the oxide layer first portion.

18 Claims, 15 Drawing Sheets

(51) Int. Cl.
*H01L 27/11521* (2017.01)
*H01L 29/788* (2006.01)

(56) References Cited

U.S. PATENT DOCUMENTS

| | | |
|---|---|---|
| 6,828,183 B1 | 12/2004 | Sung et al. |
| 7,084,453 B2 | 8/2006 | Chern et al. |
| 9,570,592 B2 | 2/2017 | Do et al. |
| 2005/0085038 A1 | 4/2005 | Tu |
| 2006/0099798 A1 | 5/2006 | Nakagawa |
| 2007/0063251 A1 | 3/2007 | Tu |
| 2008/0050875 A1 | 2/2008 | Moon |
| 2009/0085090 A1* | 4/2009 | Nagai ................ H01L 29/40114 257/316 |
| 2013/0171814 A1 | 7/2013 | Torii |

\* cited by examiner

METHOD OF FORMING SPLIT GATE MEMORY CELLS WITH THINNED TUNNEL OXIDE

FIELD OF THE INVENTION

The present invention relates to split-gate non-volatile memory cells, and more particularly to a method of forming such cells.

BACKGROUND OF THE INVENTION

Split-gate type memory cell arrays are known. For example, U.S. Pat. No. 5,029,130, which is incorporated herein by reference for all purposes, discloses a split gate memory cell and its formation, which includes forming source and drain regions in the substrate with a channel region there between. A floating gate is disposed over and controls the conductivity of one portion of the channel region, and a control gate is disposed over and controls the conductivity of the other portion of the channel region. The control gate extends up and over the floating gate. The insulation between the floating gate and the control gate is referred to as the tunnel dielectric material (e.g. oxide), because electrons tunnel through this dielectric material during the erase operation.

It is also known to form high voltage logic devices on the same wafer (substrate) as the split-gate memory cell array. FIGS. 1A-1F show the steps in forming high voltage logic devices (e.g. 12 volt logic devices) on the same wafer as the split gate memory cells according to a conventional method. A silicon semiconductor substrate 10 having an upper surface 10a, a memory cell region 14 and a logic region 16. Semiconductor substrate 10 is masked, i.e. photo resist is deposited, selectively exposed using a mask, and selectively removed, using a photolithographic process, leaving portions of the underlying material covered by remaining photo resist while leaving other portions of the underlying material (here the silicon semiconductor substrate 10) exposed. The exposed substrate portions are etched away leaving trenches that are then filled with dielectric material 12 (e.g. oxide) to form isolation regions in the logic region 16 of the wafer, as shown in FIG. 1A (after photoresist removal). Isolation regions 12 may be similarly formed in memory cell region 14 of the wafer.

A dielectric material (e.g. silicon dioxide) (hereinafter referred to as oxide) 18 is formed on the substrate 10, a layer of polysilicon (hereinafter referred to as poly) 20 is formed on oxide layer 18, and a layer of silicon nitride (hereinafter referred to as nitride) 22 is formed on poly layer 20, as shown in FIG. 1B. The wafer is masked with photoresist, and the nitride layer 22 selectively etched through openings in the photoresist in the memory cell region 14, to expose portions of the underlying poly layer 20. The exposed portions of the poly layer 20 are oxidized using an oxidation process, forming oxide areas 24 on the poly layer 20, as shown in FIG. 1C (after photoresist removal).

A nitride etch is used to remove the remaining nitride layer 22. An anisotropic poly etch is used to remove exposed portions of the poly layer 20, leaving blocks 20a of poly layer 20 underneath the oxide areas 24 in the memory cell region 14 (poly blocks 20a will constitute the floating gates of the memory cells), as shown in FIG. 1D. An oxide etch is used to remove the exposed portions of oxide layer 18 (i.e., those portions not under the remaining portion of poly layer 20). An oxide layer 26 is then formed over the structure either by deposition (which also thickens oxide areas 24) and/or by oxidation (which has no effect on oxide areas 24). A poly layer is then formed on the structure (i.e., on oxide layer 26 and oxide areas 24). The poly layer is then patterned by forming and patterning photoresist on the poly layer leaving portions of the poly layer exposed. The exposed portions of poly layer are selectively removed by poly etch, leaving poly blocks 28a in the memory cell region and poly blocks 28b in the logic region, as shown in FIG. 1E (after photoresist removal). Insulation spacers 30 are formed on the sides of poly blocks 28a and 28b by insulation material deposition and anisotropic etch, and implantations are performed to form source regions 32 and drain regions 34 in the memory cell region 14, and source regions 36 and drain regions 38 in the logic region 16, of substrate 10. The final structure is shown in FIG. 1F.

The above technique produces non-volatile memory cells (each a floating gate 20a formed from the remaining portion of poly layer 20, a control gate in the form of poly block 28a, a source 32 adjacent an end of the floating gate 20a, and a drain 34 adjacent an end of the control gate 28a) on the same substrate 10 as high voltage logic devices (each with a logic gate in the form of poly block 28b, source 36 and drain 38 adjacent first and second ends of the logic gate). There are many advantages of this technique. First, the same poly layer is used to form both control gates 28a of the memory cells and the logic gates 28b of the logic devices, using a single poly deposition. Second, the same oxide layer 26 is used as the gate oxide for the logic devices (i.e., the oxide layer used to insulate the logic gates 28b from the substrate 10), the word line oxide for the memory cells (i.e., the oxide layer used to insulate the control gates 28a from the substrate 10), and the tunnel oxide for the memory cells (i.e., the oxide insulating the floating gate 20a from the control gate 28a through which electrons tunnel in the erase operation). Common manufacturing steps for forming elements in both the memory cell region 14 and the logic region 16 simplifies, expedites and lower the costs of manufacturing. Forming oxide areas 24 by oxidation results in the floating gates 20a having a concave upper surface that terminates in a sharp edge 20b facing the control gate 28a, which enhances tunneling performance and efficiency during erase (i.e., erase operation includes placing a high voltage on the control gate 28a to cause electrons to tunnel from the sharp edge 20b of the floating gate 20a, through oxide layer 26, and to control gate). The control gate has a lower portion vertically over and insulated from the substrate 10 for controlling the conductivity of the channel region therein, and a second portion that extends up and over the floating gate 20a for voltage coupling and proximity to the floating gate sharp edge 20b for erasure.

One drawback of the above described technique is that the thickness of oxide layer 26 must be compatible for both the logic devices and the memory cells. Specifically, the oxide layer 26 must be thick enough for the high voltage operation of the logic device, provide desired performance for the control gate 28a, while being thin enough to allow tunneling from the floating gate 20a to the control gate 28a during an erase operation. Therefore, balancing these considerations, there is a lower limit to the thickness of oxide layer 26 driven by the high voltage operation of the logic device, which means the tunnel oxide in the memory cells is unnecessarily thick and therefore limits erase performance and efficiency, and limits endurance performance. However, forming the tunneling oxide separately from the word line oxide and the logic gate oxide can significantly increase manufacturing complexity, time and costs.

It would be desirable to increase memory cell erase efficiency between the floating gate and the control gate, without adversely affecting the performance of the control gate as a word line or of the logic gate in the logic device, where the same oxide layer is used in all three places.

BRIEF SUMMARY OF THE INVENTION

The aforementioned problems and needs are addressed by a method of forming a memory device that includes providing a semiconductor substrate with a substrate upper surface having a memory cell region and a logic region, forming a floating gate disposed vertically over and insulated from the memory cell region of the substrate upper surface, wherein the floating gate includes an upper surface that terminates in an edge, forming an oxide layer having a first portion that extends along the logic region of the substrate upper surface, a second portion that extends along the memory cell region of the substrate upper surface, and a third portion that extends along the edge of the floating gate, forming a non-conformal layer having a first portion that covers the oxide layer first portion, a second portion that covers the oxide layer second portion, and a third portion that covers the oxide layer third portion, wherein the third portion of the non-conformal layer has a thickness that is less than a thickness of the first and second portions of the non-conformal layer, performing an etch that removes the third portion of the non-conformal layer, and thins but does not entirely remove the first and second portions of the non-conformal layer, performing an oxide etch that reduces a thickness of the third portion of the oxide layer, wherein the first and second portions of the oxide layer are protected from the oxide etch by the first and second portions of the non-conformal layer, removing the first and second portions of the non-conformal layer, forming a control gate having a first portion on the second portion of the oxide layer and a second portion that extends up and over the floating gate, wherein the control gate is insulated from the edge of the floating gate by the third portion of the oxide layer having the reduced thickness, and forming a logic gate on the first portion of the oxide layer.

A method of forming a memory device includes providing a semiconductor substrate with a substrate upper surface having a memory cell region and a logic region, forming a floating gate disposed vertically over and insulated from the memory cell region of the substrate upper surface, wherein the floating gate includes an upper surface that terminates in an edge, forming a first oxide layer having a first portion that extends along the logic region of the substrate upper surface, a second portion that extends along the memory cell region of the substrate upper surface, and a third portion that extends along the edge of the floating gate, forming a non-conformal layer having a first portion that covers the first portion of the first oxide layer, a second portion that covers the second portion of the first oxide layer, and a third portion that covers the third portion of the first oxide layer, wherein the third portion of the non-conformal layer has a thickness that is less than a thickness of the first and second portions of the non-conformal layer, performing an etch that removes the third portion of the non-conformal layer, and thins but does not entirely remove the first and second portions of the non-conformal layer, performing an oxide etch that removes the third portion of the first oxide layer, wherein the first and second portions of the first oxide layer are protected from the oxide etch by the first and second portions of the non-conformal layer, forming a second oxide layer that extends along the edge of the floating gate, wherein the second oxide layer has a thickness that is less than a thickness of the first oxide layer, removing the first and second portions of the non-conformal layer, forming a control gate having a first portion on the second portion of the first oxide layer and a second portion that extends up and over the floating gate, wherein the control gate is insulated from the edge of the floating gate by the second oxide layer, and forming a logic gate on the first portion of the first oxide layer.

Other objects and features of the present invention will become apparent by a review of the specification, claims and appended figures.

DETAILED DESCRIPTION OF THE INVENTION

The present invention is a technique of forming memory cells and logic devices on a common substrate, where the oxide layer used as a tunnel oxide and word line oxide for the memory cells and the gate oxide for the logic devices is thinned in the memory cell region as it passes between the floating gate and the control gate.

Figure 1A:
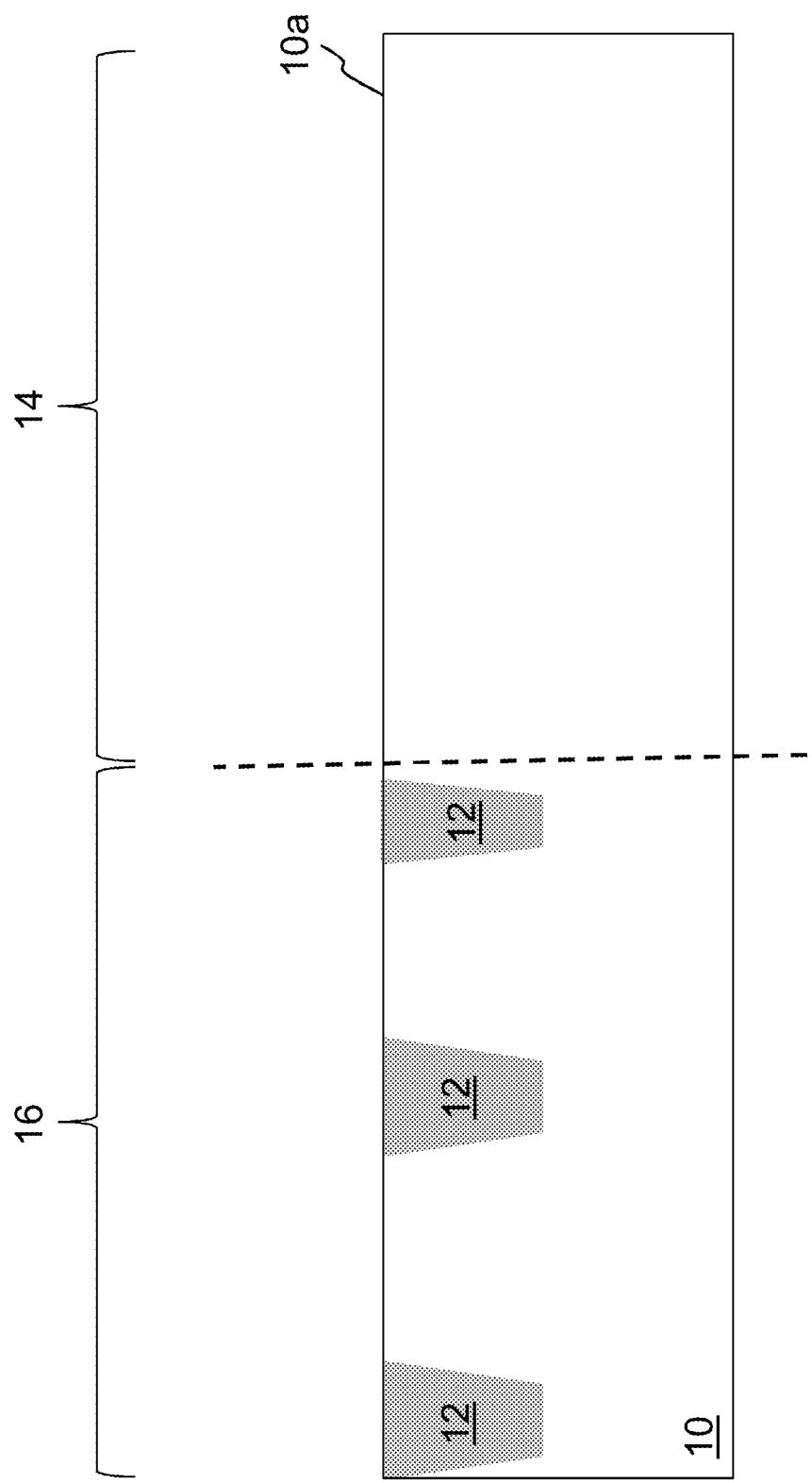
FIGS. 1A-1F are side cross-sectional views illustrating conventional steps for forming memory cells and logic devices on a common substrate.
Figure 1B:
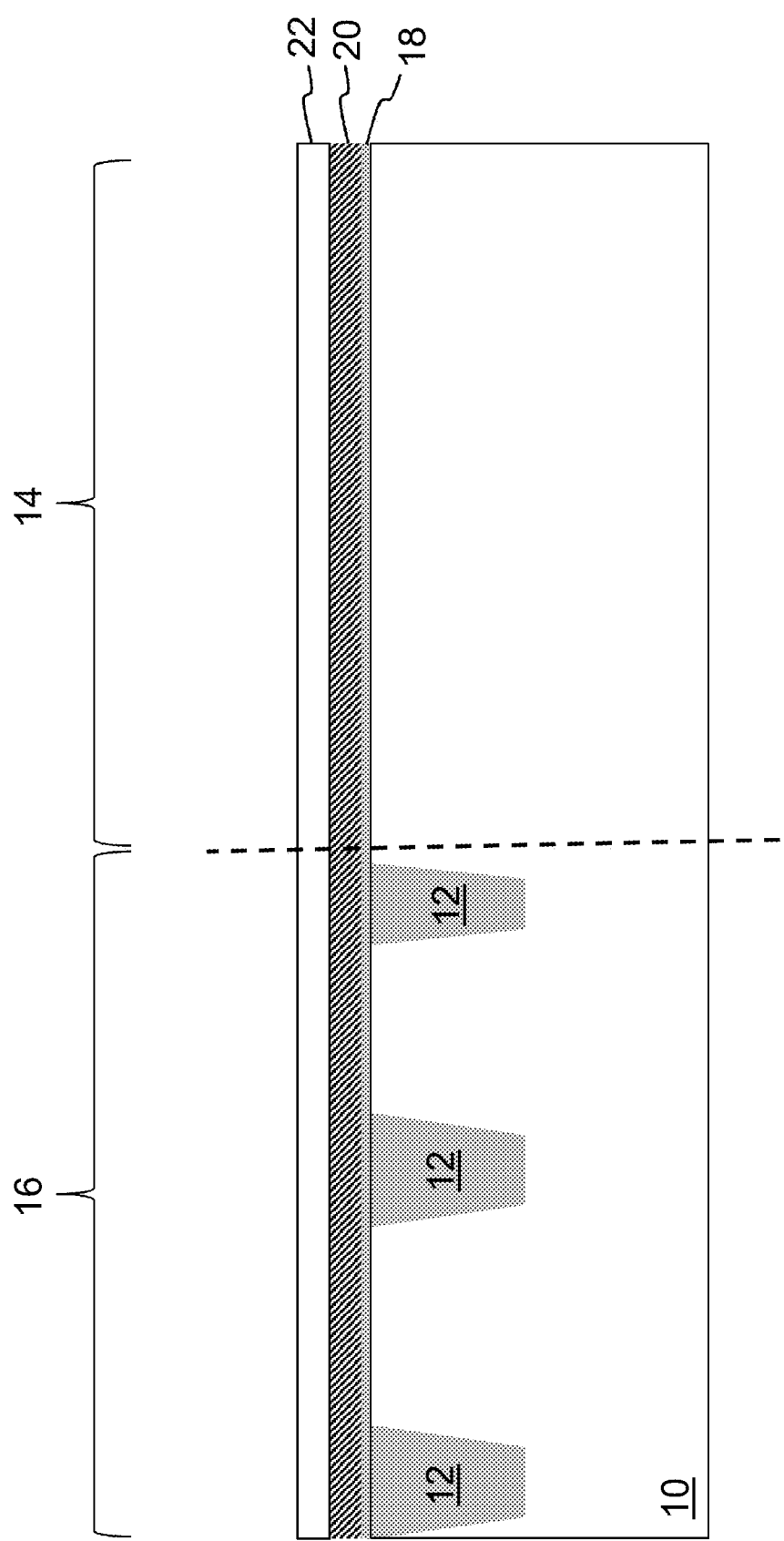
Figure 1C:
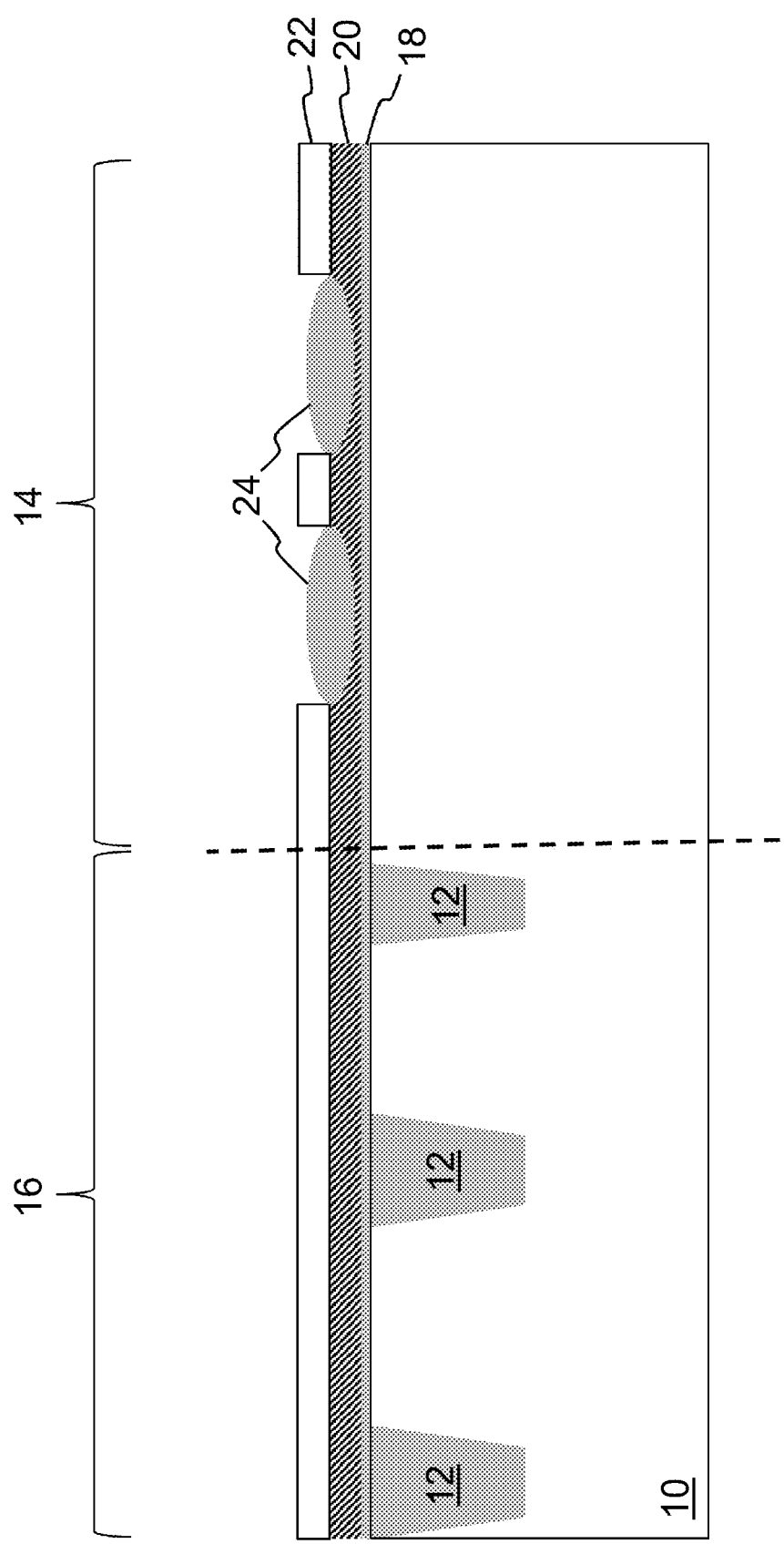
Figure 1D:
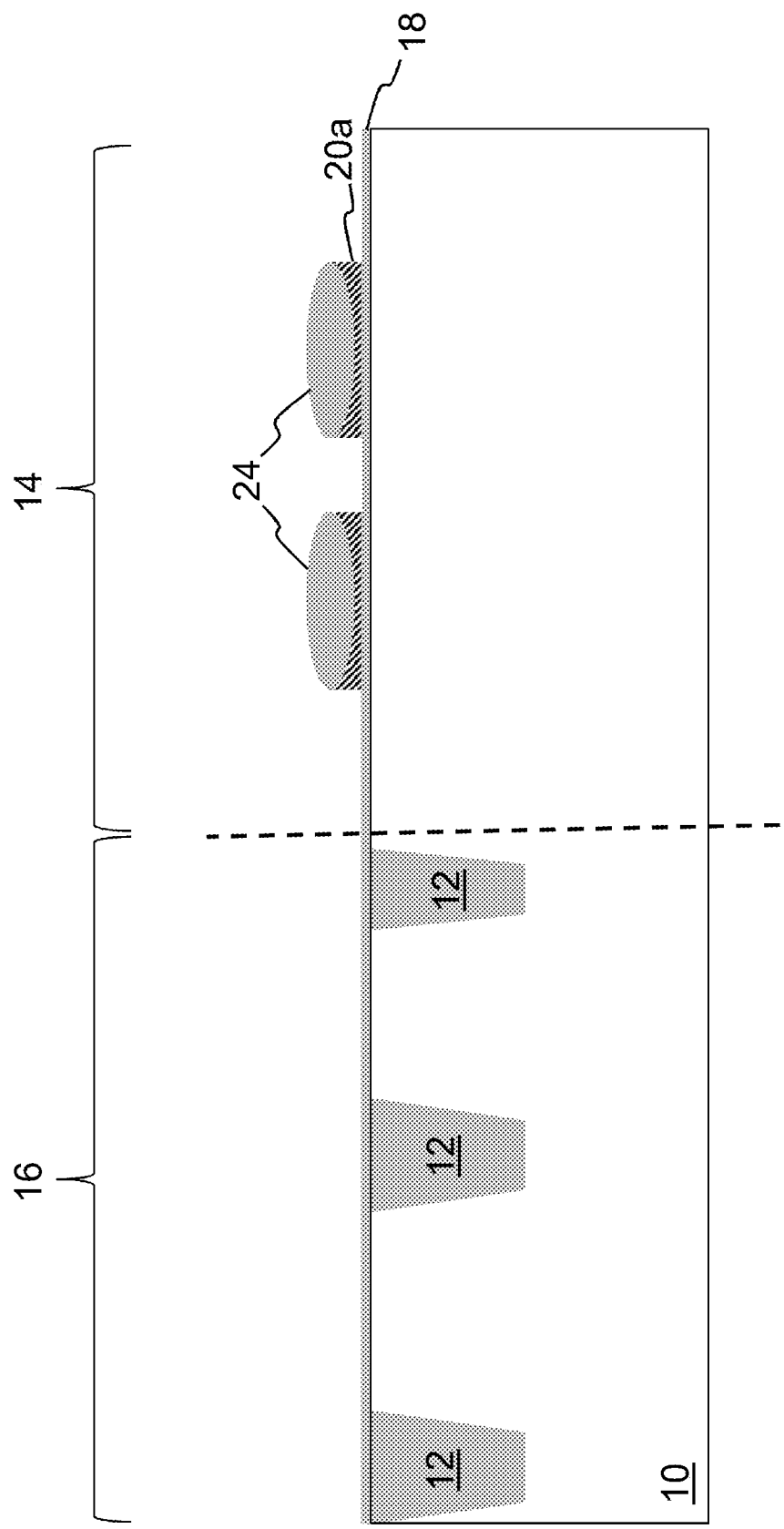
Figure 2A:
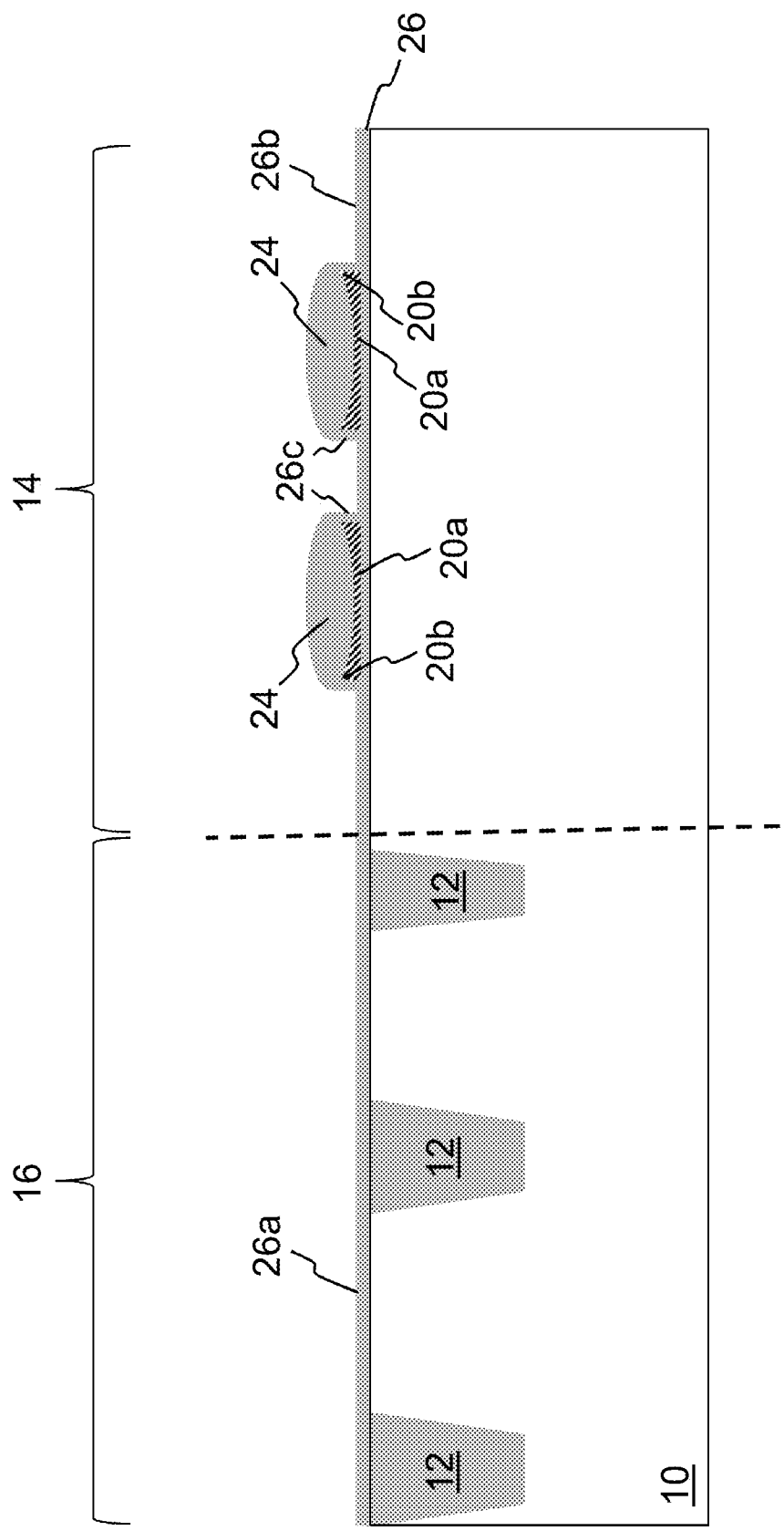
FIGS. 2A-2F are side cross-sectional views illustrating steps for forming memory cells and logic devices on a common substrate in accordance with the present embodiments.
Figure 2B:
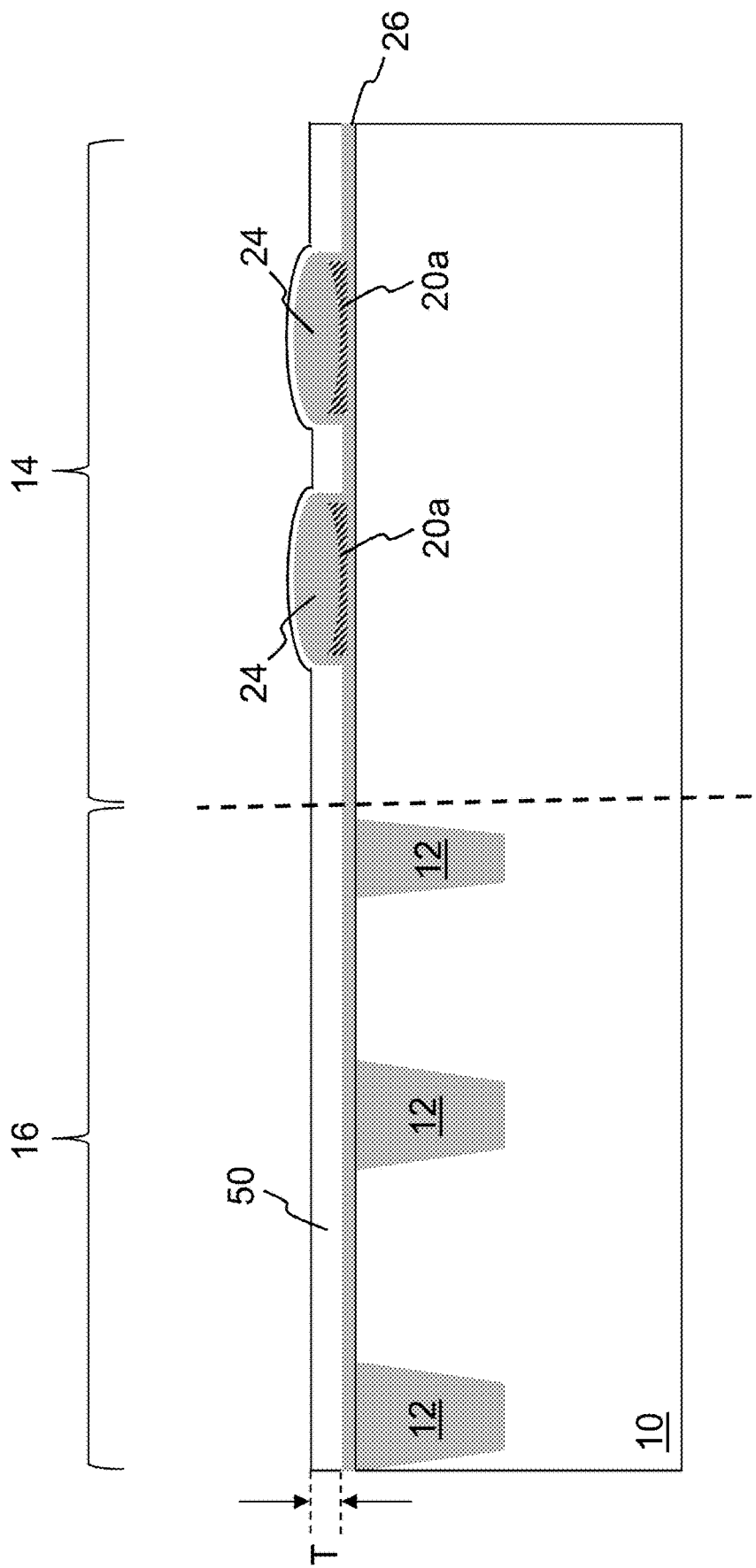

FIGS. 2A-2F disclose the steps of the method of the present invention. The process begins using the same steps described above with respect to FIGS. 1A-1D. Starting with the structure in FIG. 1D, an oxide etch is used to remove the exposed portions of oxide layer 18 (i.e., those portions not under floating gate 20a. An oxide layer 26 is then formed over the structure either by deposition (which also thickens oxide areas 24) and/or by oxidation (which has no effect on oxide areas 24) as shown in FIG. 2A. Oxide layer 26 can be considered to have three portions: a first portion 26a that extends along the logic region of the substrate upper surface, a second portion 26b that extends along the memory cell region of the substrate upper surface, and a third portion 26c that extends along the sides and sharp edges 20b of the floating gate. However, before polysilicon is deposited over oxide layer 26, the oxide layer 26 is selectively thinned adjacent the floating gates 20a in the following manner. A non-conformal layer 50 is formed on the structure (i.e., on oxide layer 26 and oxide areas 24), where the non-conformal layer 50 has a target thickness T (e.g., 200-1000 A) in planar regions of oxide layer 26, but a smaller thickness in non-planar regions of the underlying structure (i.e., those regions extending along raised structures such as oxide areas 24 and floating gates 20a), as shown in FIG. 2B. To achieve such a varying thickness, a flowable material is preferably used to form non-conformal layer 50. One non-limiting exemplary material for non-conformal layer 50 is a BARC material (bottom anti-reflectant coating), which is commonly used to reduce reflectivity at resist interfaces during photolithography. BARC materials are flowable and wettable, and are easily etched and removed with minimal process damage due their high selectivity relative to oxide. Other materials that can be used for non-conformal layer 50 include photoresist or silicon-on-glass (SOG).

Figure 2C:
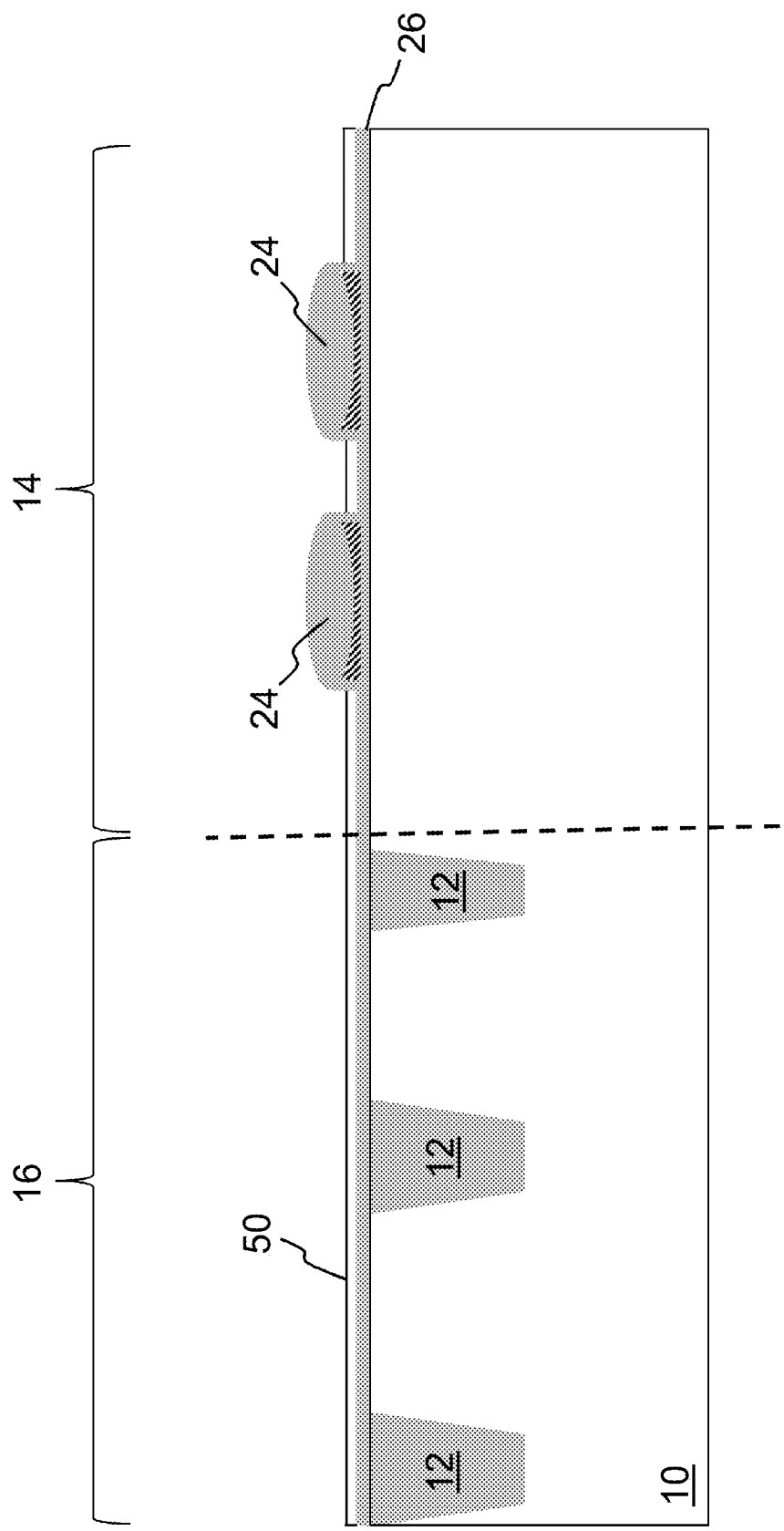
Figure 2D:
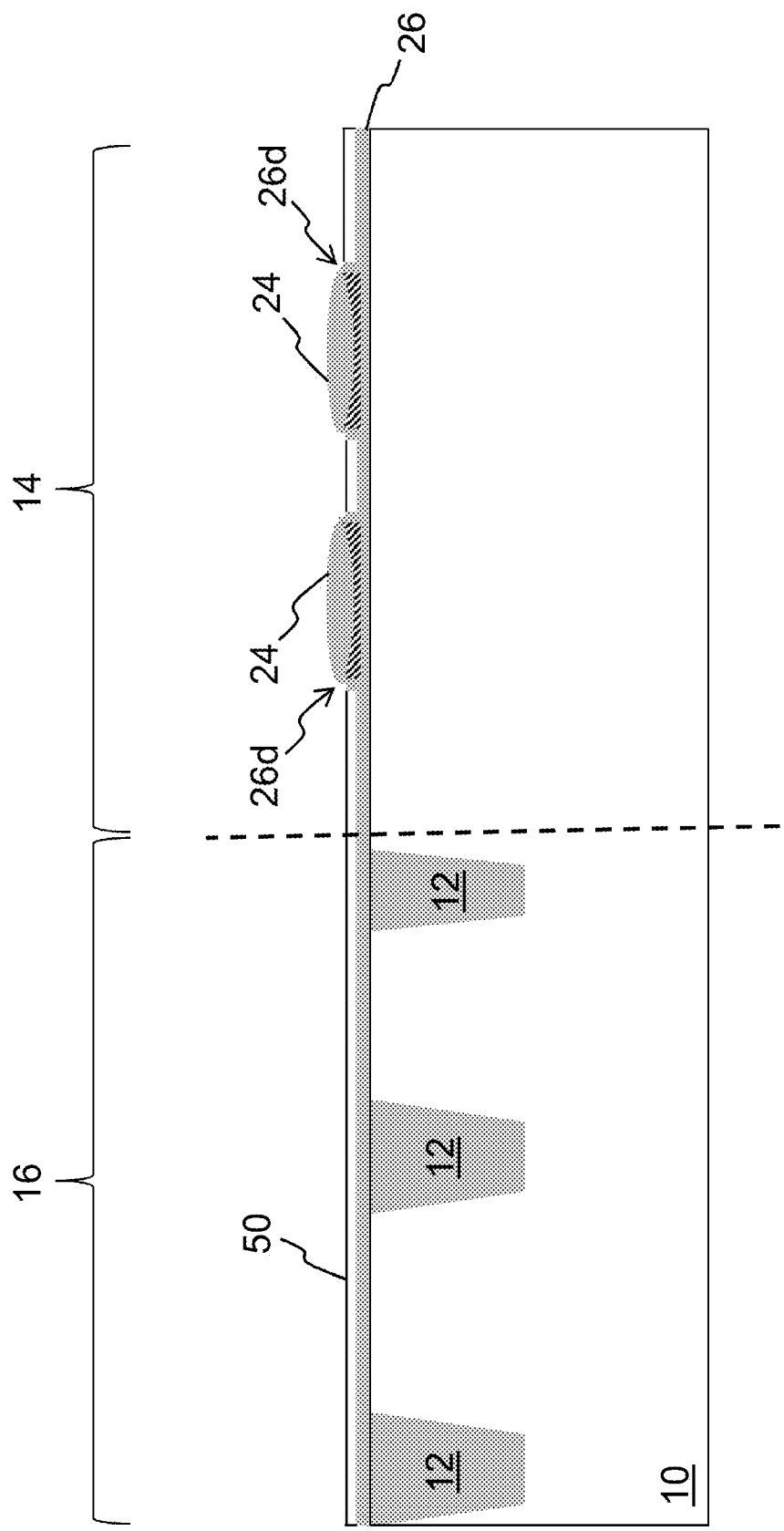

Non-conformal layer 50 is formed so that the portions of non-conformal layer 50 over the tunnel oxide portions (i.e., the portions of oxide layer 26c and oxide areas 24 around the sharp edges 20b of floating gates 20a) is thin relative to other (e.g., planar) portions of layer 50. Thereafter, a partial etch of non-conformal layer 50 is performed, to expose the tunnel oxide portions, but the etch is stopped before the planar portions of layer 26 are exposed, as shown in FIG. 2C. An optional photoresist layer can be formed in the logic region 16 but removed from the memory cell region 14 before the partial etch of layer 50, to provide additional protection of the non-conformal layer 50 from this etch for increased process margin, if non-conformal layer 50 is not formed of photoresist. An oxide etch is then performed on the exposed portions of oxide 26/24 to reduce the thickness of layer 26 (i.e., layer portion 26c) and oxide area 24 adjacent the sharp edges 20b of floating gates 20a, resulting in a thinned oxide layer 26d that will serve as the tunnel oxide for the memory cell, as shown in FIG. 2D. Non-conformal layer 50 protects the planar portions of layer 26 from this oxide etch, including those portions that will be under the to be formed logic gates and control gates.

Figure 1E:
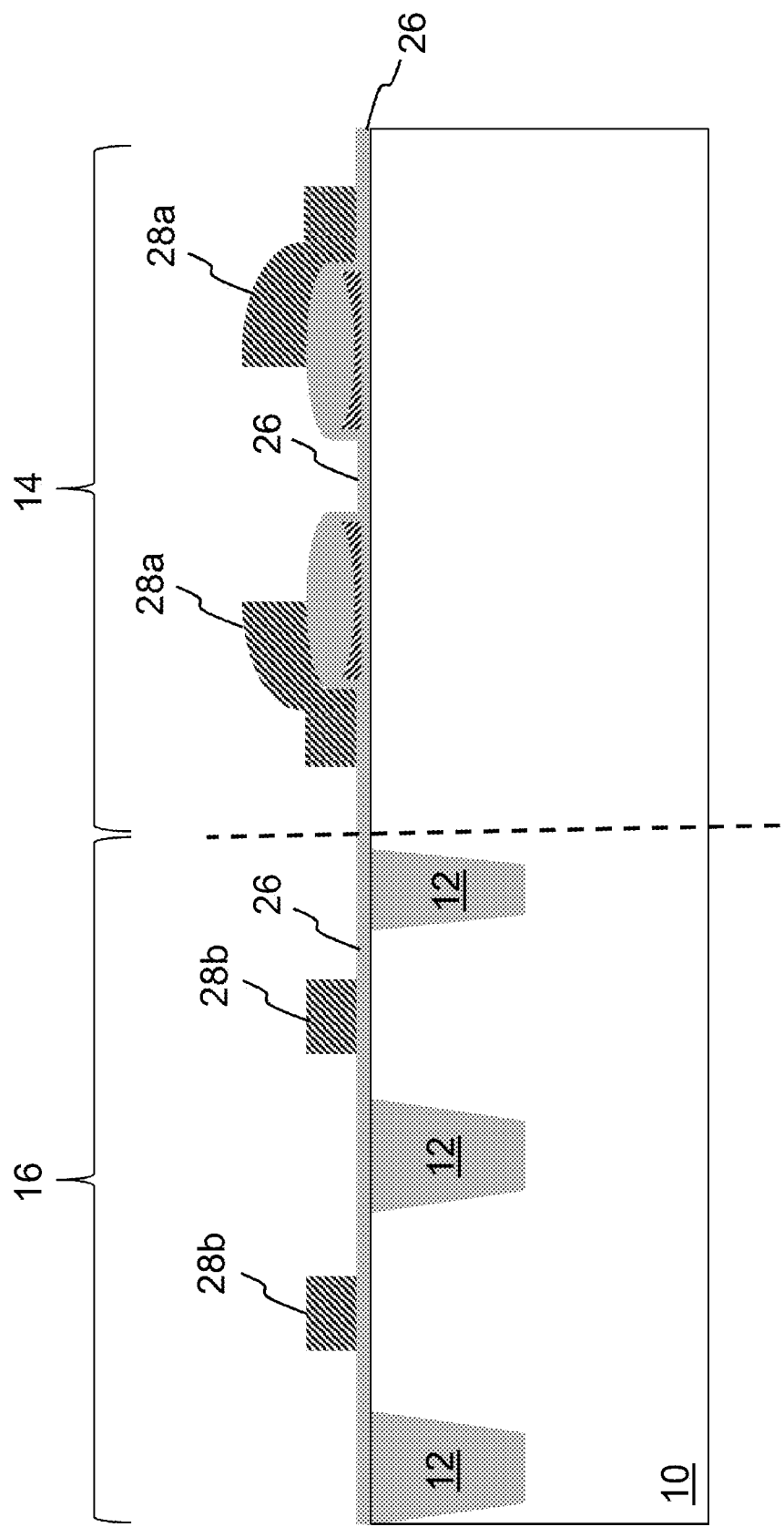
Figure 1F:
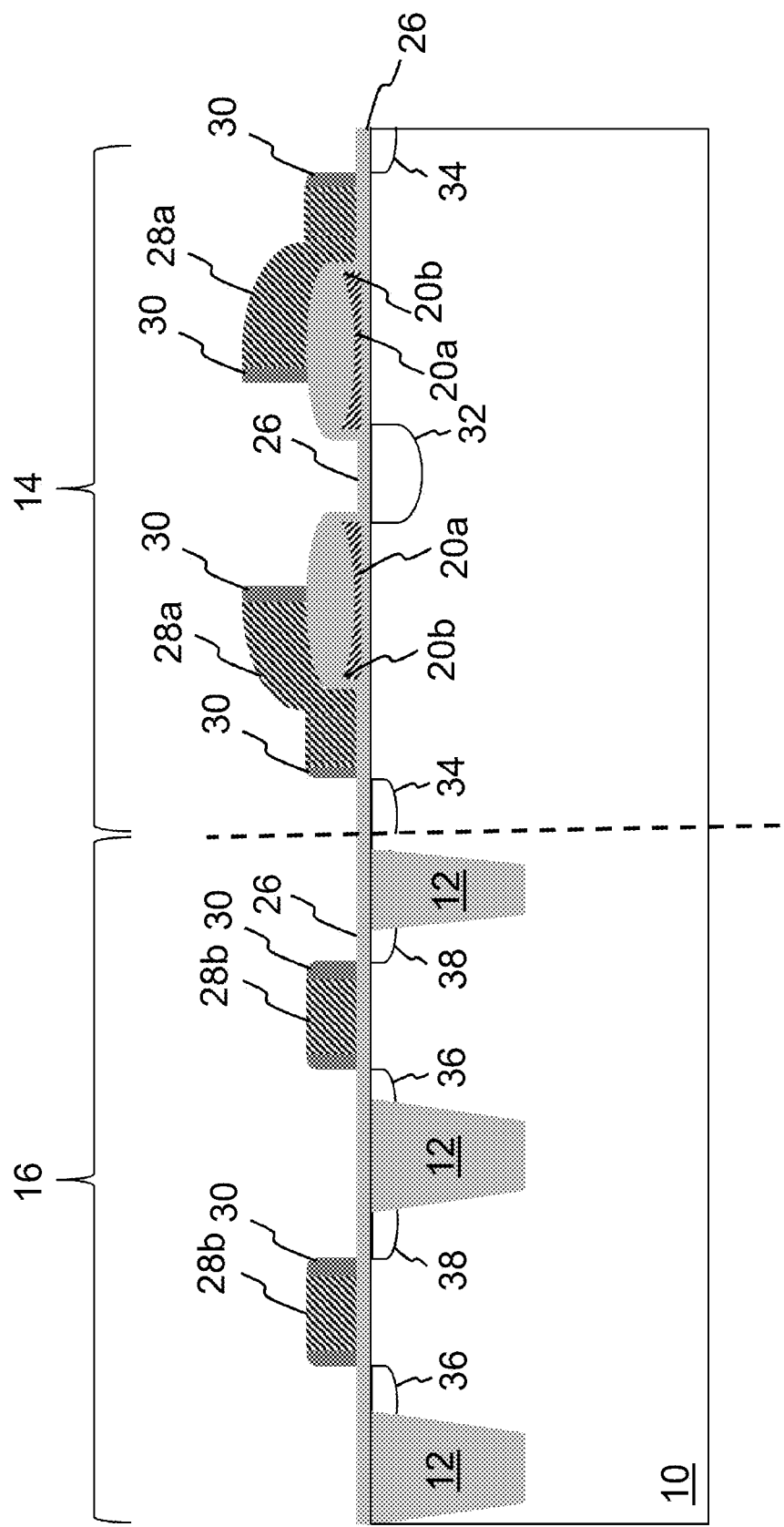
Figure 2E:
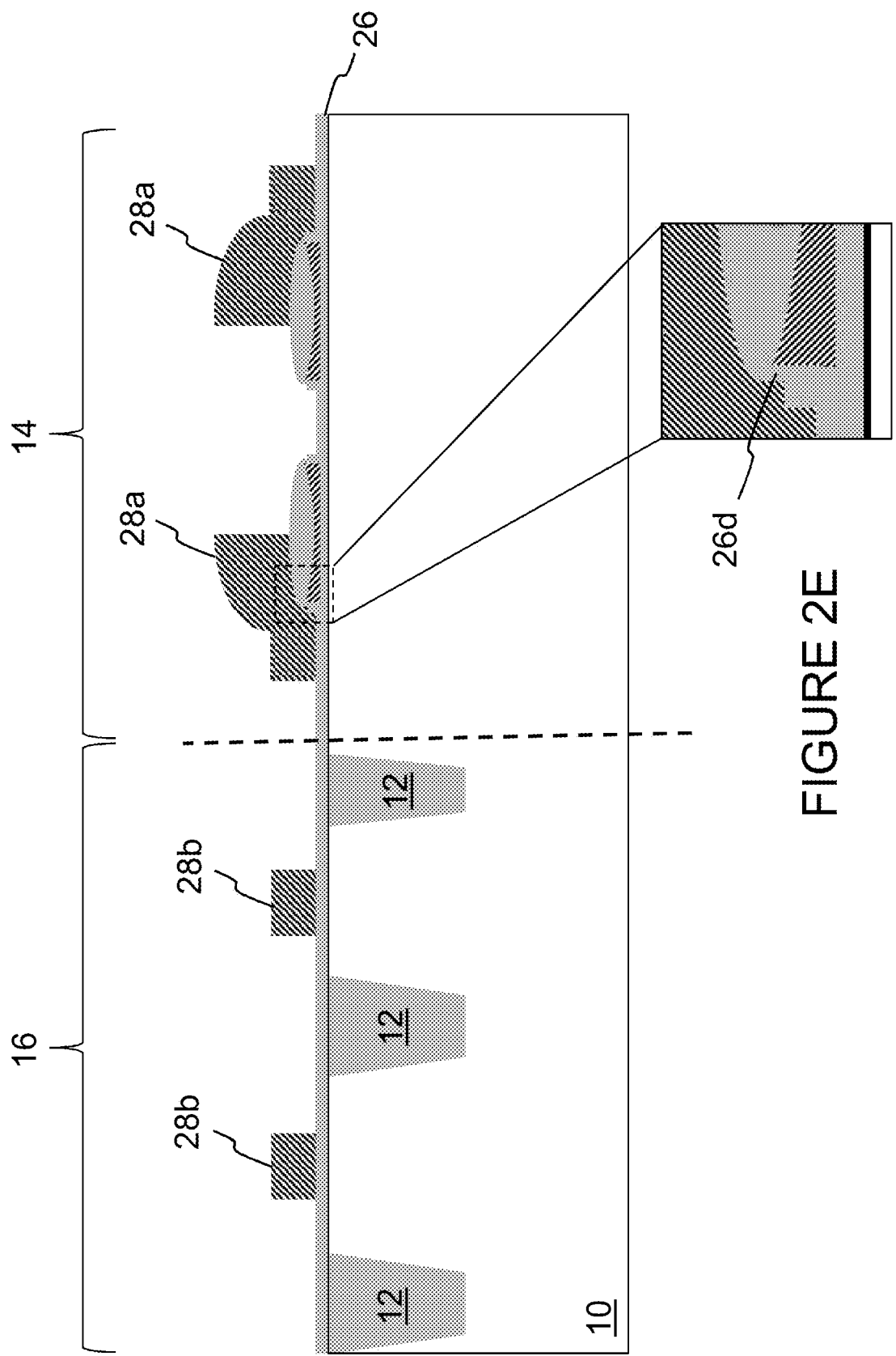
Figure 2F:
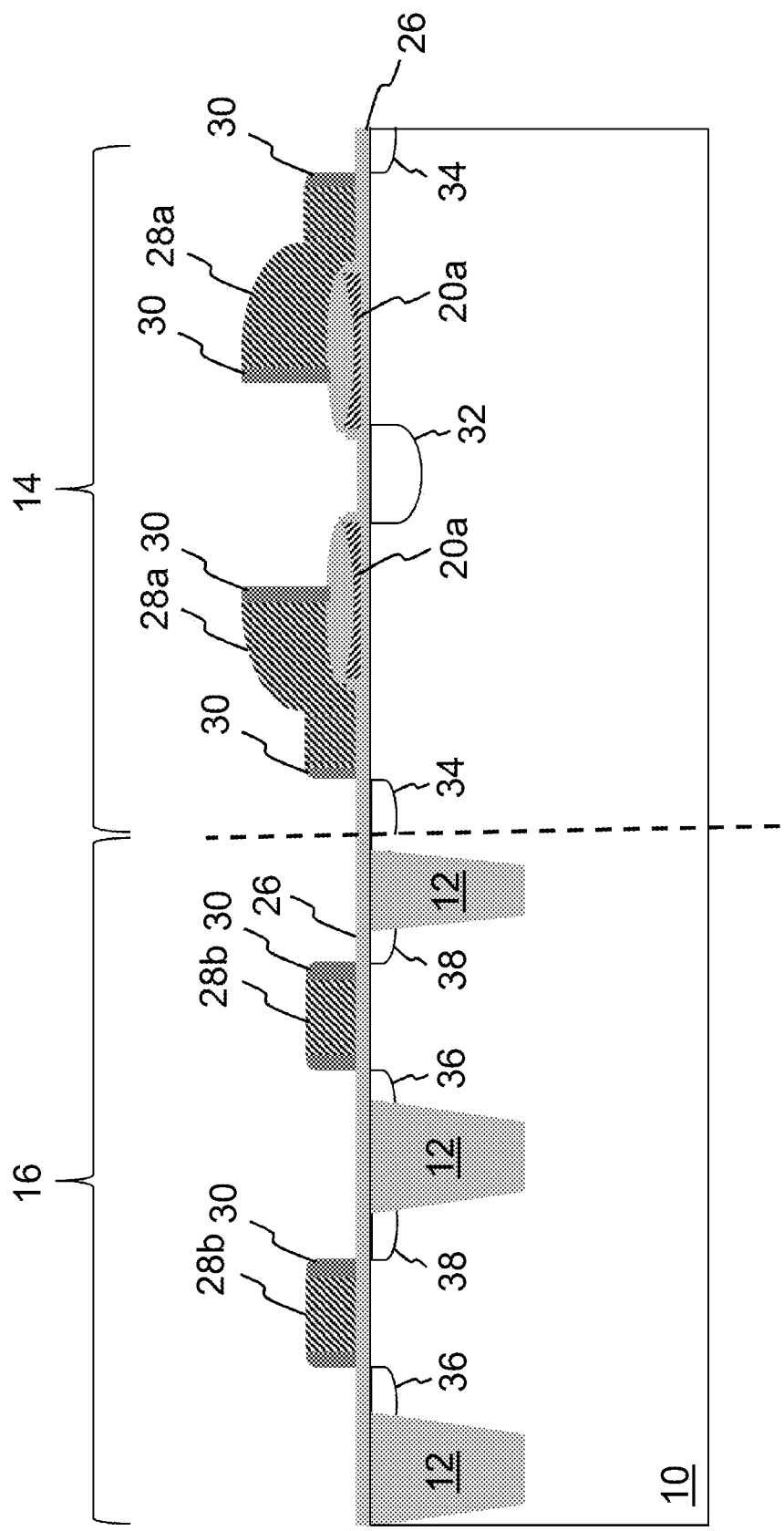

An etch is then performed to remove the remaining portions layer 50. A poly layer deposition and patterning as described above with respect to FIG. 1E is performed to form the control gates formed from poly blocks 28a and logic gates formed from poly blocks 28b, as shown in FIG. 2E. Control gates 28a are spaced from the floating gate sharp edges 20b by the thinned oxide layer 26d. The remaining steps described above with respect to FIG. 1F are performed to result in the final structure shown in FIG. 2F. Preferably a single implantation is used to simultaneously form the drain regions 34 in the memory cell region 14, and source regions 36 and drain regions 38 in the logic region 16. The resulting structure has logic gates 28b and control gates 28a insulated from the substrate 10 by oxide layer 26 having a first thickness, and control gates 28a insulated from the sharp edges 20b of floating gates 20a by the thinned portions 26d having a second thickness less than the first thickness. This structure enhances the erase efficiency and performance of the memory cell, without compromising the performance of the logic devices or adversely affecting the ability of the control gates 28a to control the conductivity of the channel region portion of the substrate underneath the control gates 28a.

Figure 3A:
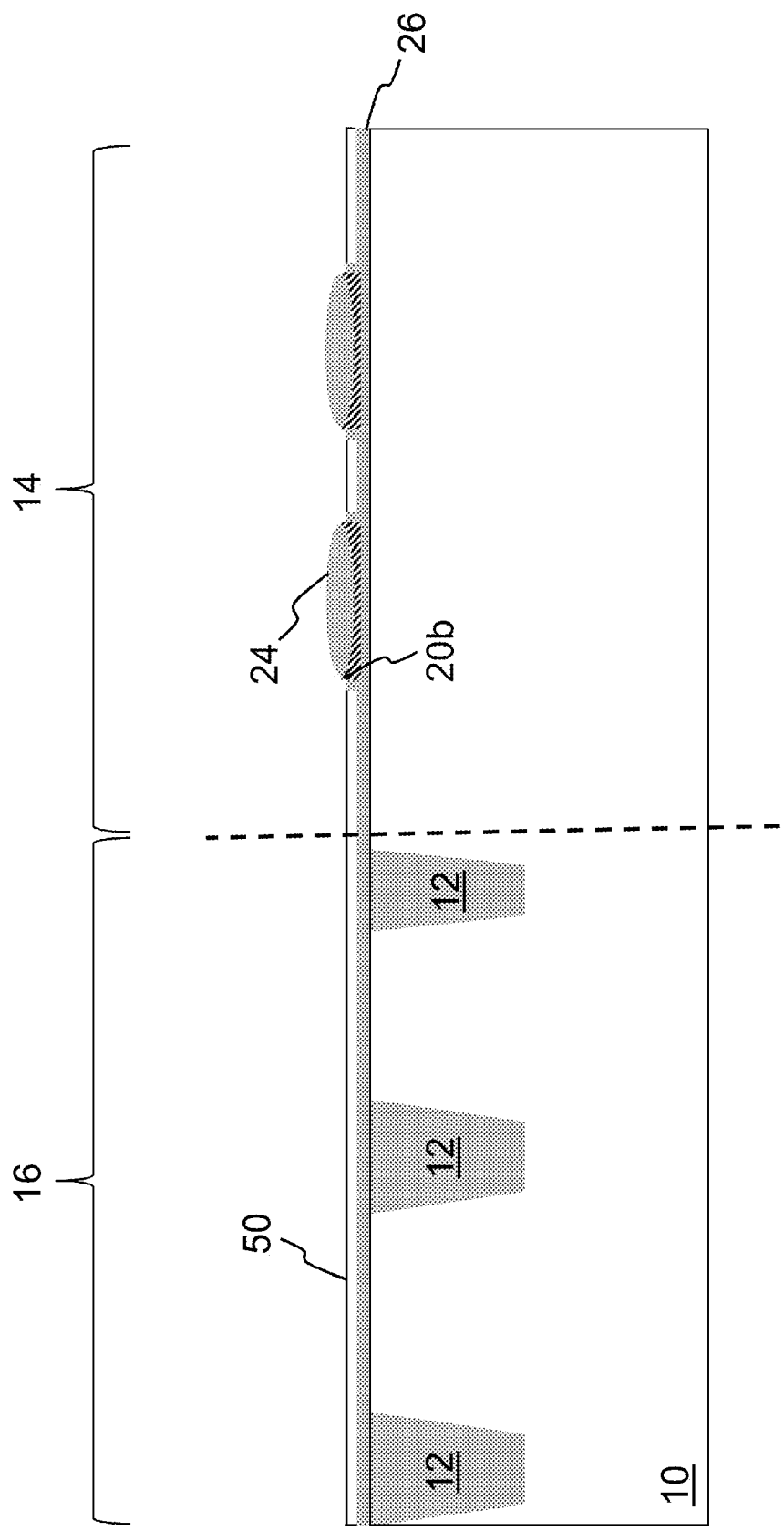
FIGS. 3A-3C are side cross-sectional views illustrating steps for forming memory cells and logic devices on a common substrate in accordance with the present embodiments.
Figure 3B:
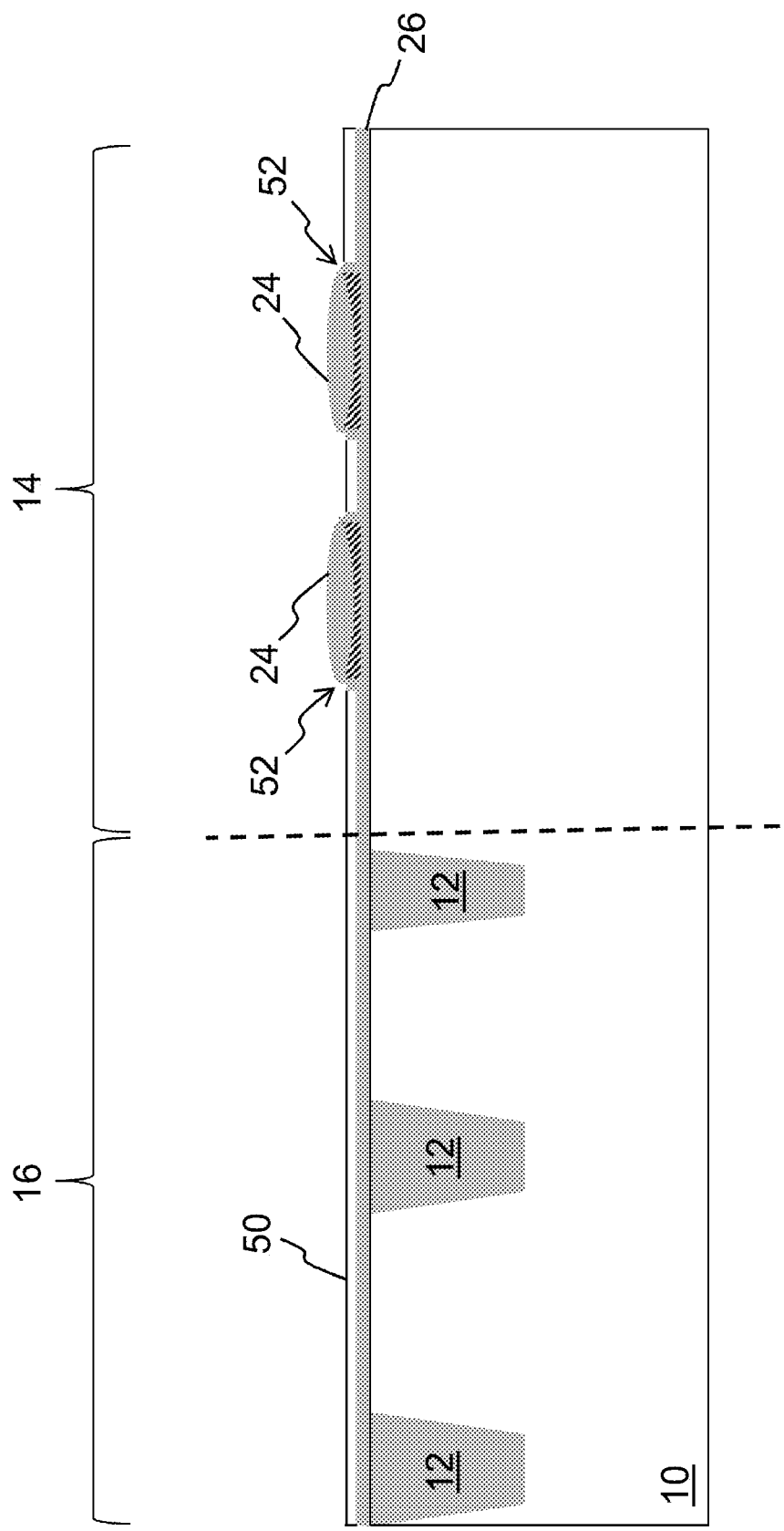
Figure 3C:
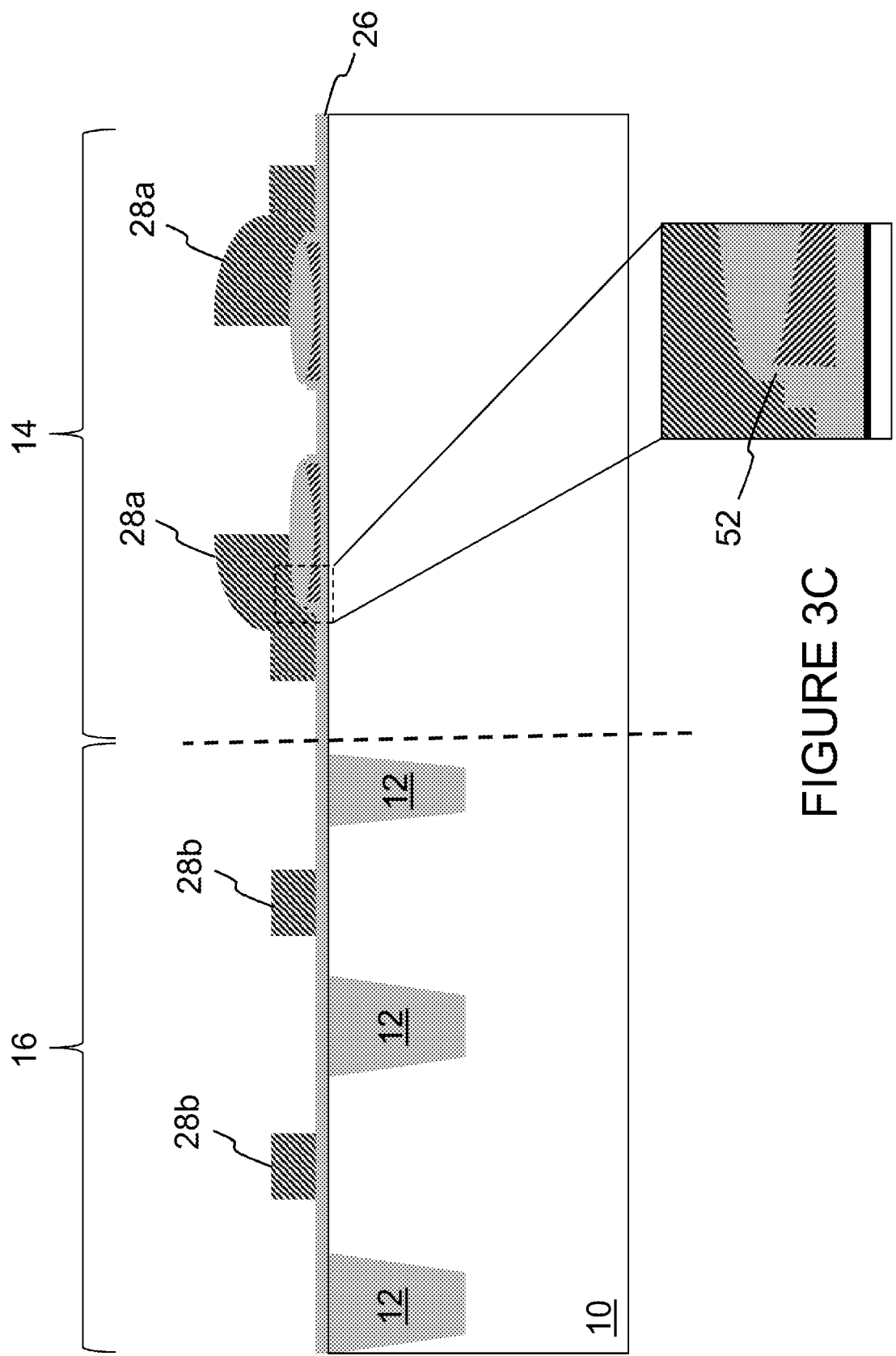

FIGS. 3A-3C illustrate an alternate embodiment, which starts with the structure of FIG. 2D. However, instead of performing an oxide etch to thin oxide layer portion 26c at the floating gate sharp edges 20b, the etch is performed to remove oxide layer portion 26c entirely, exposing the sharp edges 20b of the floating gates 20a, as shown in FIG. 3A. Then, a new oxide layer 52 is formed on the exposed sharp edges 20b by oxide deposition and/or oxidation. The remaining processing steps described above with respect to FIGS. 2E and 2F are performed to result in the final structure of FIG. 3C. The new oxide layer 52 serves as the tunnel oxide layer for the memory cells. With this embodiment, a thinned tunnel oxide is achieved by removing the originally formed oxide on the floating gate sharp edge 20b and replacing it with a new, thinner oxide layer whose thickness is less than the original oxide thickness and can be selected without any compromise or consideration of other areas of the device being formed.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of forming a memory device, comprising:
providing a semiconductor substrate with a substrate upper surface having a memory cell region and a logic region;
forming a floating gate disposed vertically over and insulated from the memory cell region of the substrate upper surface, wherein the floating gate includes an upper surface that terminates in an edge;
forming an oxide layer having a first portion that extends along the logic region of the substrate upper surface, a second portion that extends along the memory cell region of the substrate upper surface, and a third portion that extends along the edge of the floating gate;
forming a non-conformal layer having a first portion that covers the oxide layer first portion, a second portion that covers the oxide layer second portion, and a third portion that covers the oxide layer third portion, wherein the third portion of the non-conformal layer has a thickness that is less than a thickness of the first and second portions of the non-conformal layer;
performing an etch that removes the third portion of the non-conformal layer, and thins but does not entirely remove the first and second portions of the non-conformal layer;
performing an oxide etch that reduces a thickness of the third portion of the oxide layer, wherein the first and second portions of the oxide layer are protected from the oxide etch by the first and second portions of the non-conformal layer;
removing the first and second portions of the non-conformal layer;

forming a control gate having a first portion on the second portion of the oxide layer and a second portion that extends up and over the floating gate, wherein the control gate is insulated from the edge of the floating gate by the third portion of the oxide layer having the reduced thickness; and forming a logic gate on the first portion of the oxide layer.

2. The method of claim 1, further comprising:
oxidizing the upper surface of the floating gate so that the upper surface of the floating gate is concave and the edge is a sharp edge.

3. The method of claim 1, wherein the forming of the control gate and the forming of the logic gate comprise:
forming a polysilicon layer on the first, second and third portions of the oxide layer;
selectively removing portions of the polysilicon layer leaving a first portion of the polysilicon layer as the formed control gate and leaving a second portion of the polysilicon layer as the formed logic gate.

4. The method of claim 1, further comprising:
forming a first source region in the substrate adjacent an end of the floating gate;
forming a first drain region in the substrate adjacent an end of the control gate;
forming a second source region in the substrate adjacent a first end of the logic gate; and
forming a second drain region in the substrate adjacent a second end of the logic gate.

5. The method of claim 4, wherein the forming of the first drain region, the second source region and the second drain region are performed simultaneously by an implantation process.

6. The method of claim 1, wherein the non-conformal layer is formed of a flowable material.

7. The method of claim 1, wherein the non-conformal layer is formed of a BARC material.

8. The method of claim 1, wherein the non-conformal layer is formed of a photoresist material.

9. The method of claim 1, wherein the non-conformal layer is formed of a silicon-on-glass material.

10. A method of forming a memory device, comprising:
providing a semiconductor substrate with a substrate upper surface having a memory cell region and a logic region;
forming a floating gate disposed vertically over and insulated from the memory cell region of the substrate upper surface, wherein the floating gate includes an upper surface that terminates in an edge;
forming a first oxide layer having a first portion that extends along the logic region of the substrate upper surface, a second portion that extends along the memory cell region of the substrate upper surface, and a third portion that extends along the edge of the floating gate;
forming a non-conformal layer having a first portion that covers the first portion of the first oxide layer, a second portion that covers the second portion of the first oxide layer, and a third portion that covers the third portion of the first oxide layer, wherein the third portion of the non-conformal layer has a thickness that is less than a thickness of the first and second portions of the non-conformal layer;
performing an etch that removes the third portion of the non-conformal layer, and thins but does not entirely remove the first and second portions of the non-conformal layer;
performing an oxide etch that removes the third portion of the first oxide layer, wherein the first and second portions of the first oxide layer are protected from the oxide etch by the first and second portions of the non-conformal layer;
forming a second oxide layer that extends along the edge of the floating gate, wherein the second oxide layer has a thickness that is less than a thickness of the first oxide layer;
removing the first and second portions of the non-conformal layer;
forming a control gate having a first portion on the second portion of the first oxide layer and a second portion that extends up and over the floating gate, wherein the control gate is insulated from the edge of the floating gate by the second oxide layer; and
forming a logic gate on the first portion of the first oxide layer.

11. The method of claim 10, further comprising:
oxidizing the upper surface of the floating gate so that the upper surface of the floating gate is concave and the edge is a sharp edge.

12. The method of claim 10, wherein the forming of the control gate and the forming of the logic gate comprise:
forming a polysilicon layer on the first, second and third portions of the first oxide layer;
selectively removing portions of the polysilicon layer leaving a first portion of the polysilicon layer as the formed control gate and leaving a second portion of the polysilicon layer as the formed logic gate.

13. The method of claim 10, further comprising:
forming a first source region in the substrate adjacent an end of the floating gate;
forming a first drain region in the substrate adjacent an end of the control gate;
forming a second source region in the substrate adjacent a first end of the logic gate; and
forming a second drain region in the substrate adjacent a second end of the logic gate.

14. The method of claim 13, wherein the forming of the first drain region, the second source region and the second drain region are performed simultaneously by an implantation process.

15. The method of claim 10, wherein the non-conformal layer is formed of a flowable material.

16. The method of claim 10, wherein the non-conformal layer is formed of a BARC material.

17. The method of claim 10, wherein the non-conformal layer is formed of a photoresist material.

18. The method of claim 10, wherein the non-conformal layer is formed of a silicon-on-glass material.

* * * * *